United States Patent
Taniguchi et al.

[11] Patent Number: 5,952,717
[45] Date of Patent: *Sep. 14, 1999

[54] SEMICONDUCTOR DEVICE AND METHOD FOR PRODUCING THE SAME

[75] Inventors: Yoshikuni Taniguchi, Kanagawa; Keiko Sogo, Chiba, both of Japan

[73] Assignee: Sony Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/574,854

[22] Filed: Dec. 19, 1995

[30] Foreign Application Priority Data

Dec. 29, 1994 [JP] Japan .................................. 6-339670

[51] Int. Cl.⁶ .......................... H01L 23/28; H01L 23/48; H01L 23/12; A05K 1/18
[52] U.S. Cl. .......................... 257/734; 257/673; 257/646; 257/676; 257/696; 257/698; 257/692; 257/693
[58] Field of Search ..................................... 257/734, 668, 257/673, 676, 678, 687, 688, 690, 696, 698, 784, 786, 787

[56] References Cited

U.S. PATENT DOCUMENTS

| | | | |
|---|---|---|---|
| 4,691,225 | 9/1987 | Murakami et al. | 257/693 |
| 5,347,159 | 9/1994 | Khandros et al. | 257/696 |
| 5,357,139 | 10/1994 | Yaguchi et al. | 257/676 |
| 5,375,041 | 12/1994 | McMahon | 257/688 |
| 5,394,303 | 2/1995 | Yamaji | 257/690 |
| 5,444,299 | 8/1995 | Tsukada et al. | 257/696 |
| 5,493,150 | 2/1996 | Matsuoka et al. | 257/668 |
| 5,528,018 | 6/1996 | Shin | 257/666 |
| 5,536,969 | 7/1996 | Matsuoka | 257/666 |
| 5,583,375 | 12/1996 | Tsubusaki et al. | 257/696 |
| 5,668,406 | 9/1997 | Egawa | 257/690 |
| 5,760,471 | 6/1998 | Fujisawa et al. | 257/698 |
| 5,781,852 | 1/1994 | Normington | 257/692 |

FOREIGN PATENT DOCUMENTS

| | | | |
|---|---|---|---|
| 59-129448 | 7/1984 | Japan | 257/692 |
| 2-229443 | 9/1990 | Japan | 257/698 |
| 5-55399 | 3/1993 | Japan | 257/690 |
| 5-206314 | 8/1993 | Japan | 257/690 |
| 5-235238 | 9/1993 | Japan | 257/690 |
| 5-335437 | 12/1993 | Japan | 257/690 |

*Primary Examiner*—Alexander Oscar Williams
*Attorney, Agent, or Firm*—Rader, Fishman & Grauer; Ronald P. Kananen

[57] ABSTRACT

A semiconductor device which is greatly reliable and is also advantageous in high-density mounting, as well as the method for producing the semiconductor device, includes a filmy material placed along the peripheral sides of the semiconductor chip and along one surface of the semiconductor chip. The conductor pattern is provided on the filmy material such that one end of the pattern is connected to the corresponding electrode which has been provided on the other surface of the semiconductor chip and the other end is opposed to the back of the semiconductor chip. Hereby a semiconductor device can be realized which is greatly reliable and is also advantageous for high-density mounting. Besides, the semiconductor device is produced in such a way that a cutting and bending process of each lead and the film tape is performed toward the tape carrier package, so that the other end of each lead is opposed to the back of the semiconductor chip, holding the film tape between them. Hereby a method can be realized for producing a semiconductor device which is greatly reliable and is also advantageous for high-density mounting.

9 Claims, 9 Drawing Sheets

SEMICONDUCTOR DEVICE AND METHOD FOR PRODUCING THE SAME

BACKGROUND OF THE INVENTION

1. Field of the Invention

This invention relates to a semiconductor device and a method for producing the semiconductor device, and more particularly, is applicable to a TCP (tape carrier package).

2. Description of the Related Art

In recent years, a high-density mounting technology of electronic parts on a circuit board has been achieved, with the miniaturization of electronic components.

For example as a mounting method for mounting heretofore, an IC chip on a board, heretofore, as shown in FIG. 1, the method is widely used wherein each electrode of an IC chip 1 is connected to the corresponding lead terminal 3 via a gold wire 2, etc. The IC chip 1 and the base portion of each lead terminal 3 are molded integrally with a resin 4, so that a semiconductor package 5 (for instance, QFP (quad flat package)) is formed, and then the tip portion of each lead terminal 3 of the semiconductor package 5 is bonded to the corresponding electrode of the board (not shown) by solder, etc.

However, in this mounting method, the surrounding resin 4 (package), which protects the IC chip 1 from the external environment, is large in comparison with the size of the IC chip which is the mounting object, hence there have been such problems that the whole mounting area becomes so large that it is not suited to high-density mounting.

Therefore in recent years, in order to realize high-density mounting, the method has been proposed and implemented wherein an uncovered IC chip is mounted on the board without molding (hereinafter, this is referred to as the bear-chip mounting method).

The a bear-chip mounting method, includes the TCP (tape carrier package) mounting method, and the flip chip (F/C) mounting method, etc. For instance, in the TCP mounting method, an IC chip is mounted on the board according to the following procedure.

That is, as shown in FIGS. 2A and 2B, at first a lead 11 which is comprised of a copper leaf (for instance, about 30 μm thick) is formed on a film tape 10 made from polyimide, etc. with the stated pattern, and then an inner portion of each lead 11 (inner lead) is bonded to the corresponding electrode of the IC chip 1 via a bump which has been made of tin (Sn) or gold (Au), etc., and then the circuit side 1A of the IC chip 1 is sealed with silicone resins 12, etc., hereby the so-called TCP 13 is formed.

Subsequently, forming of the TCP 13 into the gull-wing shape is performed by bending the tip portion of each lead 11 (outer lead) into the ladle shape, as shown in FIG. 3B, utilizing the forming metal-molds 20A and 20B shown in FIG. 3A, and the excessive tape is cut off. Then, as shown in FIG. 3C, the tip portion of each lead 11 is bonded (outer lead bonding: OLB) on the corresponding land 22 of the board 21 by thermo-compression bonding, etc.

The TCP mounting method like this has the advantages such that the circuit side 1A of the IC chip 1 which generates heat during operation is not opposed to the board 21 but mounted to face upward, hence the thermal radiation property is sufficient. a pad of the IC chip 1 is connected to the corresponding land 22 of the board 21 via a lead 11 (copper leaf) of the TCP 13 which has elasticity and thickness of about 30 μm, therefore stress which is owing to the difference between the thermal expansion coefficients can be decreased so that reliability during the heat-cycle is increased.

The F/C mounting method is implemented in such a way that a bump 25 is formed on each pad 1B of an IC chip 1 with solder, gold (Au), etc. As shown in FIG. 4A, these bumps 25 are respectively aligned with the corresponding lands 27 of a board 26 and then mounted to those face-down. Then each bump 25 is exposed to reflowing so that each bump 25 of the IC chip 1 is bonded to the corresponding land 27 of the board 26 as shown in FIG. 4B, then sealing resin 29 is streamed into the gap 28 between the IC chip 1 and the board 26 and hardened, as shown in FIG. 4C. Thus, the F/C mounting method has the advantage such that the mounting area for the IC chip 1 may be merely the size of the IC chip 1 itself, therefore high-density mounting can be performed.

Additionally, as a method for mounting IC chips 1 on the board with much higher density, the method is frequently utilized wherein the IC chip 1 is packaged to the form of ceramic chip carrier (LCCC) or the form of plastic chip carrier (PLCC) which are smaller than the plastic QFP. Lead terminals 32 and 34 of these are placed respectively on the sides of the parts, as shown in FIGS. 5A and 5B. For instance, a LCCC 30 is formed by bonding the IC chip 1 to a carrier 33 of a board of ceramic using the wire bonding method, etc., and a PLCC 31 is formed by sealing the IC chip 1 with molding material similar to a plastic QFP.

However, the TCP mounting method has had the problems such that the IC chip 1 is bonded to the film tape 10, hence the mounting area becomes larger than the size of the IC chip itself, as can be seen in FIGS. 3A to 3C. Therefore it is not suited to high-density mounting, and each lead 11 is very thin so that it is very week to external force and apt to be deformed, bended, or cut.

The TCP mounting method has also had problems such that irregularity in lateral direction (skew) and irregularity in vertical direction (coplanarity) of the leads 11 of the TCP which is not mounted yet are apt to be generated. If these skew and coplanarity become worse, at the time of mounting to the board 21, it becomes difficult to position each lead 11 onto the corresponding land 22 of the board 21, and defective connection is apt to be generated owing to floating foot after soldering.

Moreover, the TCP mounting method has had problems such that if some substance touches the film tape 10 of the mounted TCP 13, the lead 11 is deformed and, in a severe case, it may be cut.

On the other hand, F/C mounting method has had the problems such that the soldered portions (the bump 25 and the land 27) are hidden under the IC chip 1 as can be seen in FIGS. 4A to 4C, because the IC chip 1 is mounted on the board 26 by face-down, as a result visual inspection is difficult.

Besides, the F/C mounting method has had problems such that insurance of reliability in heat-cycle is difficult because of stress, which is generated owing to the difference between the thermal expansion coefficients of the IC chip 1 and the board 26, is centralized in the bump 25. Therefore stress is usually dissipated by sealing the gap between the IC chip 1 and the board 26 with sealing resin 29, however it is difficult to select the resin and a high degree of sealing technique is required, owing to the fact that the gap 28 between the IC chip 1 and the board 26 is 50 to 100 μm. Additionally, the F/C mounting method has had the problem such that the normal radiation property is poor because the circuit side 1A of the IC chip 1 which generates heat is opposed to the board 26.

Besides, in the case of the LCCC 30 and the PLCC 31 (FIGS. 5A and 5B) there has been the problem that the size becomes larger than that of the IC chip itself because of using the carrier 33 which has been made from ceramics or plastics (especially, in the case of the PLCC 30, it becomes much larger than the case of the LCCC 31, because it is sealed with molding material), so that they are disadvantageous to high-density mounting.

SUMMARY OF THE INVENTION

In view of the foregoing, an object of this invention is to provide a semiconductor device which is greatly reliable and is also advantageous for high-density mounting, as well as the method for producing the semiconductor device.

The foregoing object and other objects of the invention have been achieved by the provision of a semiconductor device according to a first embodiment, which comprises a semiconductor chip 1; a filmy material 41 which has been placed along the peripheral side 1C of the semiconductor chip 1 and the back 1D of the semiconductor chip 1; a conductor pattern 42 of which one end has been connected with a corresponding electrode, which has been directly provided on the other surface 1A of the semiconductor chip 1, and the other end of it has been provided on the filmy material 41 so as to be opposed to the back 1D of the semiconductor chip 1; and the device is mounted on the board 60 in such a way that a part which has been opposed to the back 1D of the semiconductor chip 1, out of the conductor pattern 42, is bonded to the corresponding electrode 61 of the board 60.

Further, according to the first embodiment, a seal means 43 for sealing one surface 1A of the semiconductor chip 1 is provided.

Further, according to the first embodiment, the filmy material 41 has adhesive property so as to stick on the semiconductor chip 1.

Further, according to the first embodiment, the filmy material 41 is comprised of a film tape 41 of a tape carrier package 50 which is composed in such a way that leads 42 are laminated on the film tape 41 with the stated pattern, and then one end of each lead 42 is directly connected to the corresponding electrode of the semiconductor chip 1; and the conductor pattern 42 is comprised of the leads 42 of the tape carrier package 50.

Further, according to the first embodiment, the tape carrier package 50 is composed in such a way that each lead 42 is laminated on the film tape 41, excepting one end.

Moreover, according to a second embodiment, a semiconductor device is produced in such a way that a cutting and bending process of each lead 42 and a film tape 41 is performed toward a tape carrier package 50 which has been composed in such a way that the leads 42 are laminated on the film tape 41 with the stated pattern and then one end of each lead 42 is directly connected to the corresponding electrode of the semiconductor chip 1, so that the other end of each lead 42 is opposed to the back 1D of the semiconductor chip 1, holding the film tape 41 between them.

Moreover, according to the second embodiment, the cutting and bending process is comprised of a first step of bending each lead 42, so that each lead 42 is opposed to a peripheral side 1C of the semiconductor chip 1, holding the film tape 41 between them; a second step of cutting off the unnecessary parts of each lead 42 and the film tape 41; and a third step of bending each lead 42 and the film tape 41, so that the other end of the lead 42 is opposed to the back 1D of the semiconductor chip 1, holding the film tape 41 between them.

Furthermore, according to the second embodiment, the tape carrier package 50 is composed in such a way that each lead 42 is laminated on the film tape 41, excepting one end.

In the first embodiment, the filmy material 41 is placed along the peripheral sides of the semiconductor chip 1 and one surface 1D of the semiconductor chip 1, and the conductor pattern 42 is provided on the filmy material 41 such that one end is directly connected to the corresponding electrode which has been provided on the other surface 1A of the semiconductor chip 1 and the other end is opposed to one surface 1D of the semiconductor chip 1; hereby the semiconductor device 40 can be produced which has nearly the same size as that of the semiconductor chip 1. In this case, bonding of the semiconductor device 40 to the board 60 is performed via the conductor pattern 42, hence, it is scarcely affected by stress which is generated due to the discrepancy of the thermal expansion coefficient with the board 60, so that high degree of reliability can be obtained even during the heat cycle. As a result, a highly reliable semiconductor device can be realized which is advantageously applicable to high-density mounting.

Besides, in the second embodiment, the semiconductor device 40 is produced in such a way that a cutting and bending process of each lead 42 and the film tape 41 is performed toward the tape carrier package 50, so that the other end of each lead 42 is opposed to the back 1D of the semiconductor chip 1, holding the film tape 41 between them; hereby the semiconductor device 40 according to the first invention can be formed, in this way, a method for producing a highly reliable semiconductor device which is advantageously applicable to high-density mounting can be realized.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 6:
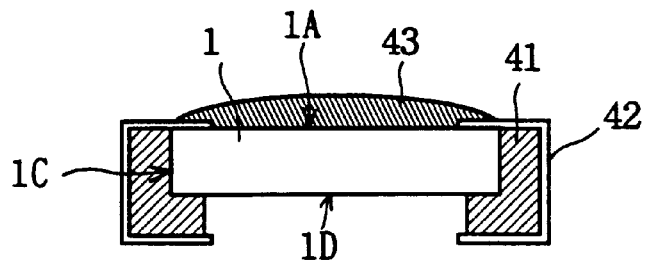
FIG. 6 is a cross-sectional view showing the constitution of a semiconductor device according to an embodiment.
Figure 7:
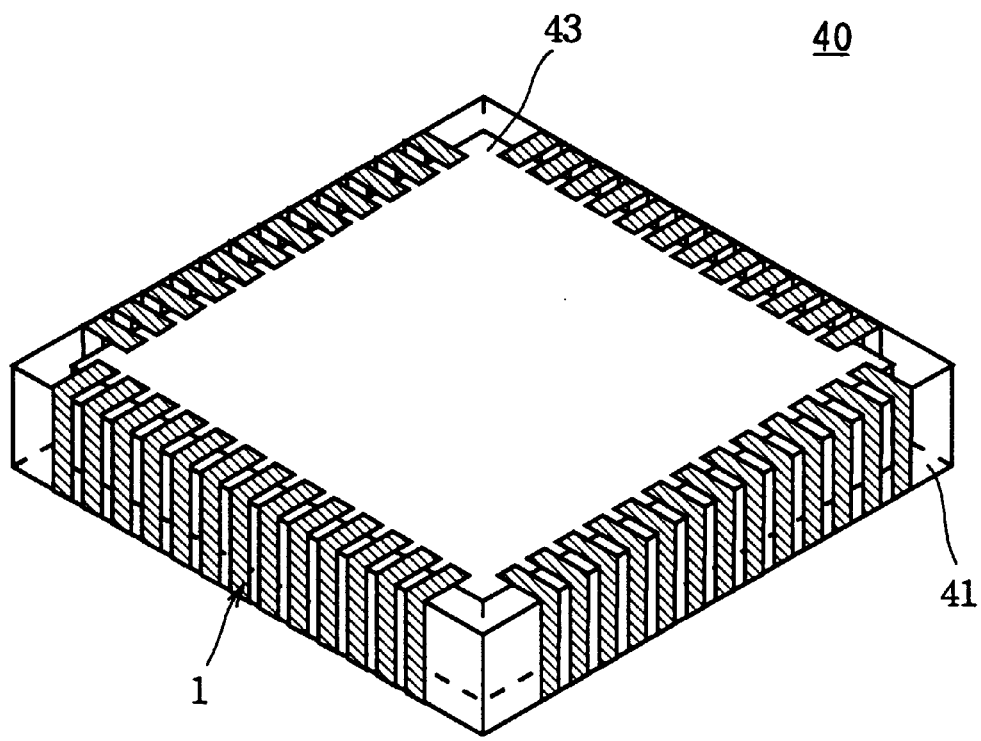
FIG. 7 is a perspective view showing the constitution of the semiconductor device according to the embodiment.

Preferred embodiments of this invention will be described with reference to the accompanying drawings:

In FIG. 6 and FIG. 7, the numeral 40 shows generally a semiconductor device according to the embodiment. A film tape 41 which has been made from polyimide, etc. is placed along each peripheral side 1C and the margin part of the back 1D (the surface which is opposite with the circuit side 1A) of the IC chip 1.

Leads 42, which are comprised of copper leafs, etc. and having the stated pattern respectively, are formed on the surface of the film tape 41. One end (inner lead) of each lead 42 is directly connected electrically to the corresponding pad (not shown) which has been formed on the circuit surface 1A of the IC chip 1 such that leads 42 are in direct contact with the corresponding pad of the IC chip 1, and the other end (outer lead) is extending to the back side of the IC chip 1. Besides, the circuit surface 1A, including the inner lead portion of each lead 42, is sealed up with silicone resins 43 for sealing.

In this way, the semiconductor device 40 is nearly as large as the IC chip 1, while the circuit surface 1A and the peripheral sides 1C can be preserved from external environment such as humidity by means of the sealing resin 43 or the film tape 41 respectively.

Figure 8A:
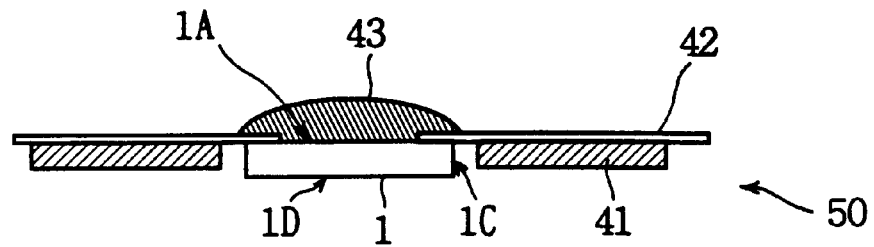
FIGS. 8A and 8B are a cross-sectional view and a top view showing the constitution of the TCP which is the root of the semiconductor device of the embodiment.
Figure 8B:
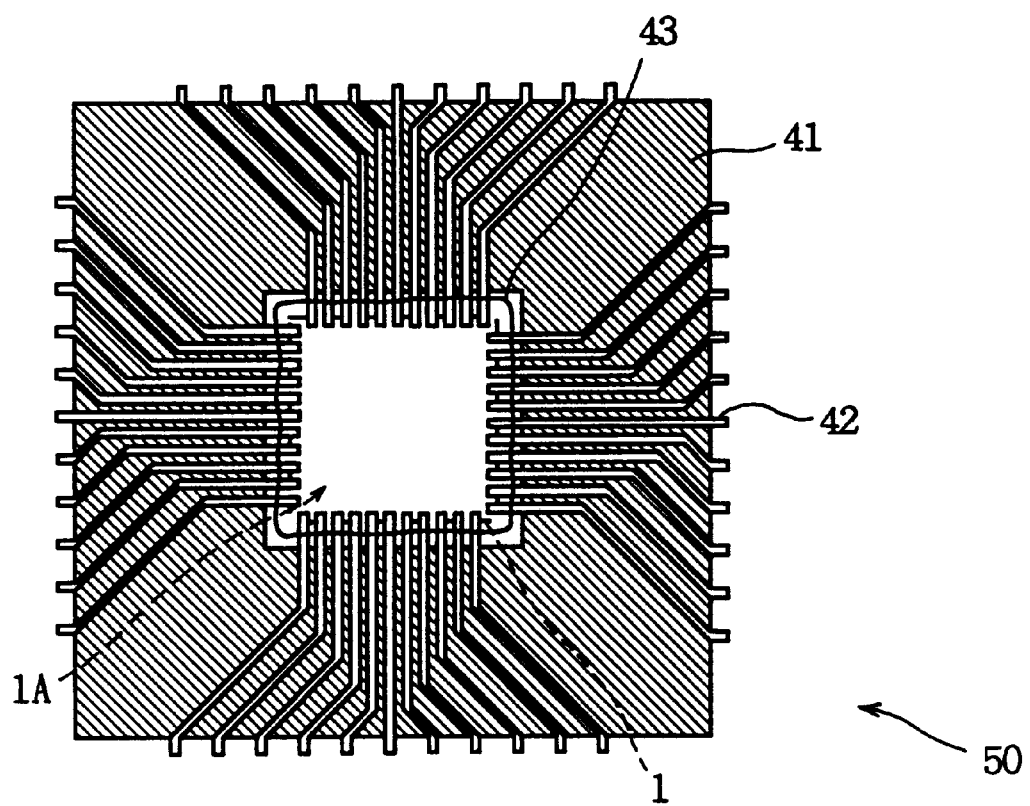

In fact, the semiconductor device 40 can be produced by the following steps, using the TCP 50 shown in FIGS. 8A and 8B, wherein only the inner circular part of the film tape 41 of the TCP 50 has been stamped out.

Figure 9A:
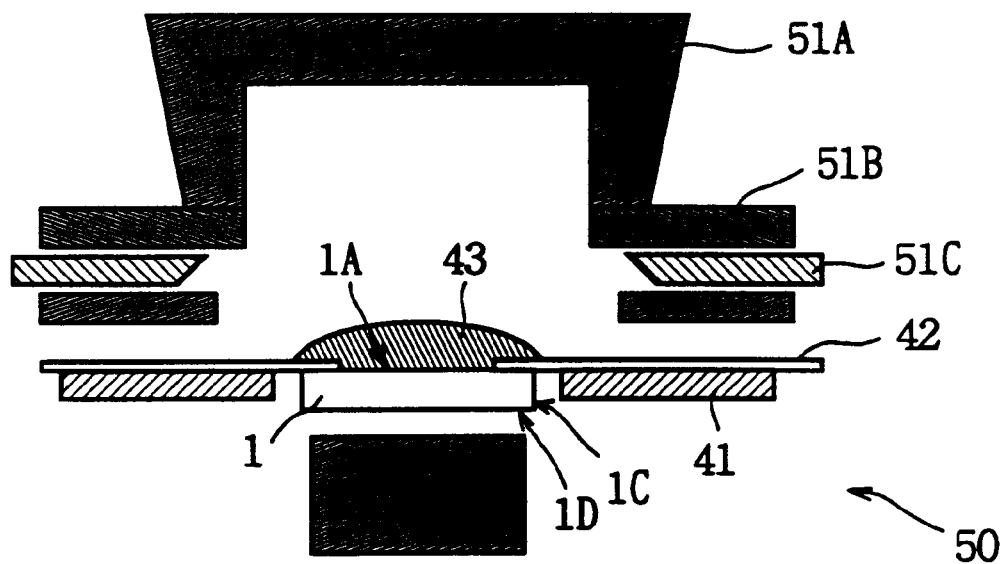
FIGS. 9A, 9B, 10A and 10B are cross-sectional views showing the manufacturing process of the semiconductor device of the embodiment.
Figure 9B:
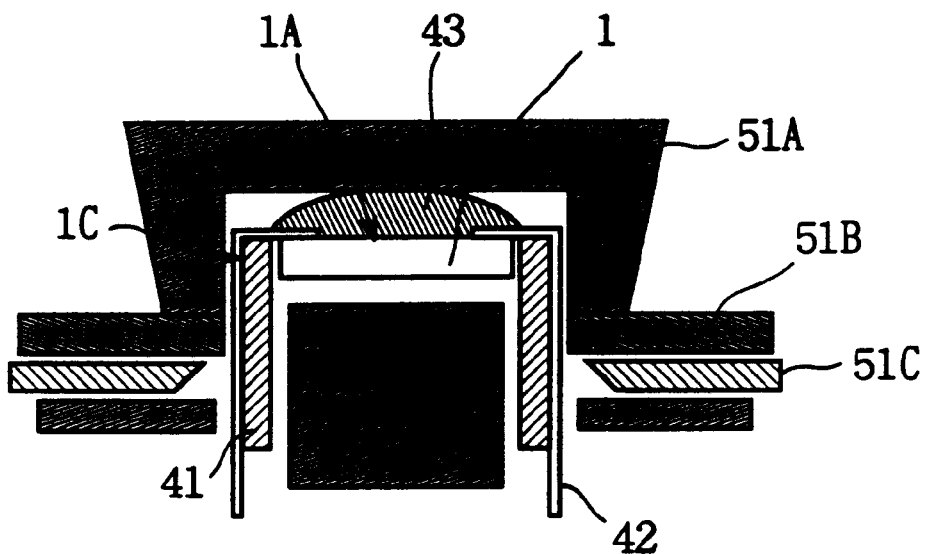

That is, the TCP 50 shown in FIGS. 8A and 8B is processed using a two-stage forming dies shown in FIG. 9A. The lead 42 is bent by the first stage die 51A, so that the film tape 41 lies along the peripheral side 1C of the IC chip 1, as shown in FIG. 9B.

Figure 10:
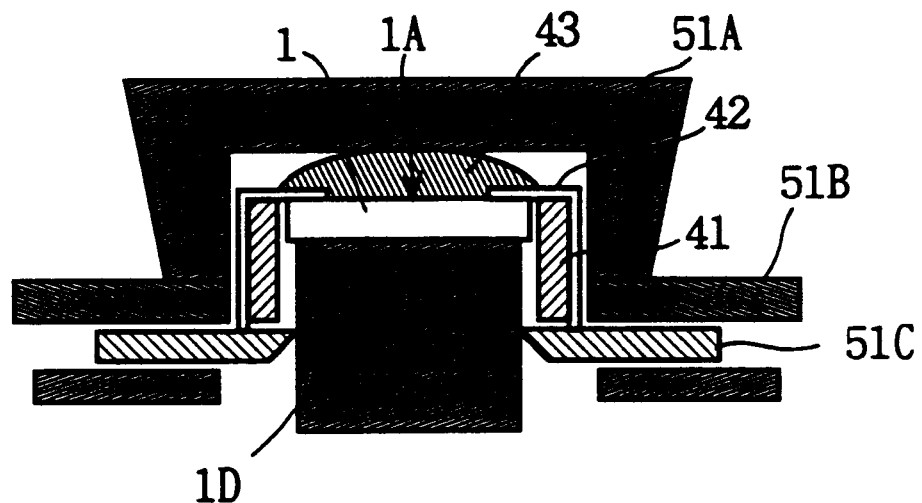
Figure 10:
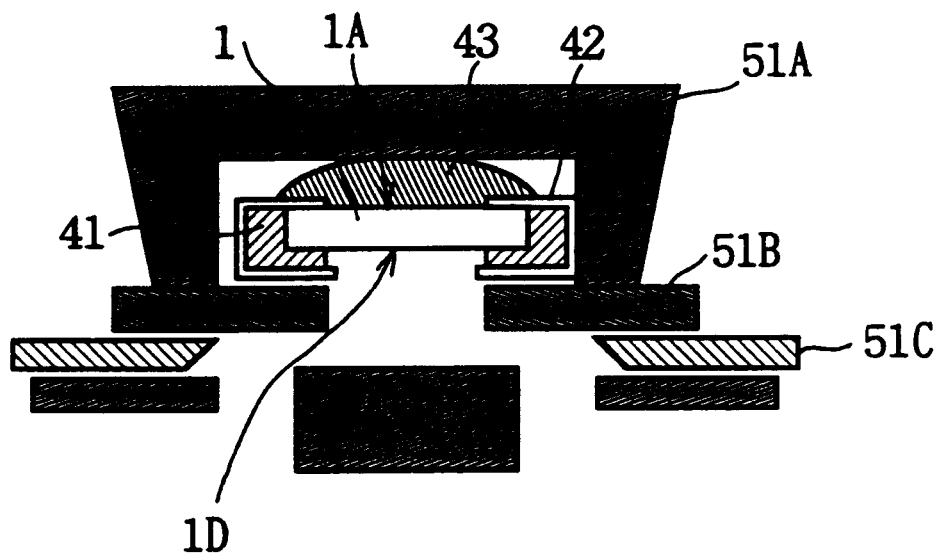

Subsequently, excessive part of the lead 42 and the film tape 41 of the TCP 50 are cut off by a cutter 51C, as shown in FIG. 10A. Then, the film tape 41 (and the lead 42) are bent by the second stage die 51B, so that they lie along the back 1D of the IC chip 1, as shown in FIG. 10B. In this case, the bending process of the film tape 41 (and the lead 42) may be performed to ward the parts which are respectively corresponding to the opposed two sides out of four sides of the IC chip 1 at a time, hereby the semiconductor device 40 shown in FIG. 6 and FIG. 7 can be produced.

Figure 11:
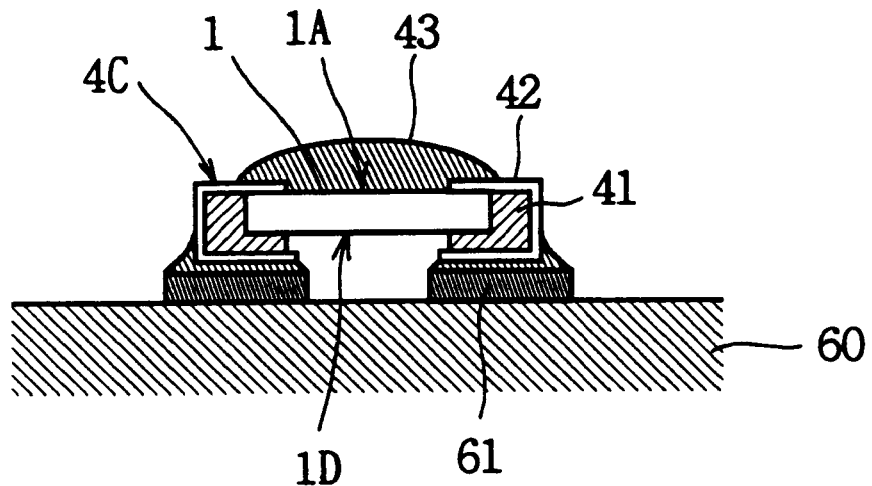
FIG. 11 is a cross-sectional view showing the semiconductor device of the embodiment which has been mounted on a board.
Figure 1:
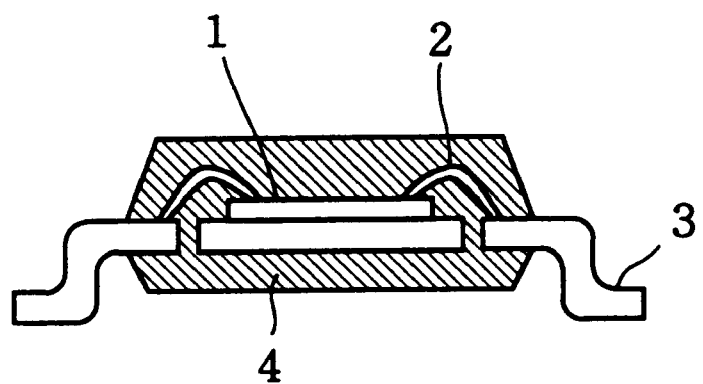
FIG. 1 is a cross-sectional view explaining a mounting method of the conventional IC chip.

In the above constitution, the semiconductor device 40 can be mounted on the board 60 as shown in FIG. 11, by soldering the other end portion of each lead 41 onto the corresponding land 61 of the board 60.

Figure 3A:
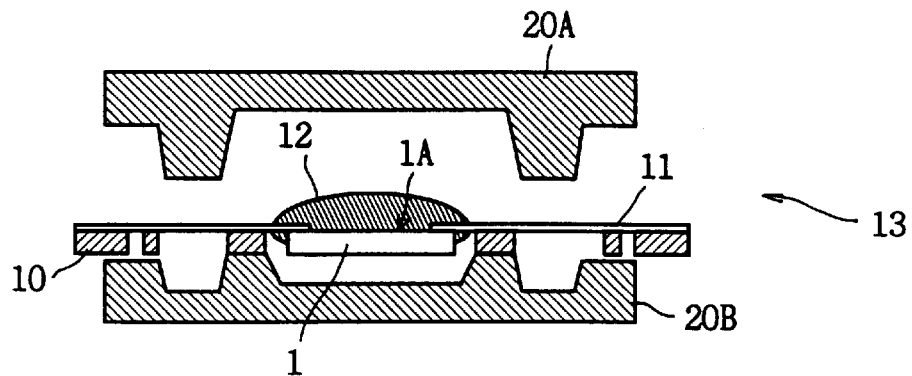
FIGS. 3A to 3C are cross-sectional views showing the process for mounting the IC chip on the board according to the TCP mounting method.
Figure 3B:
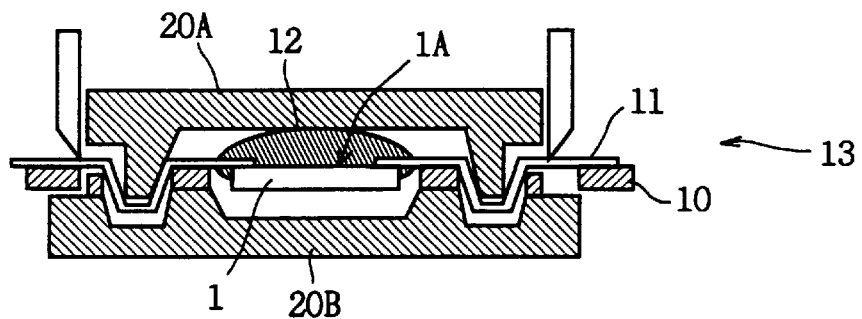
Figure 3C:
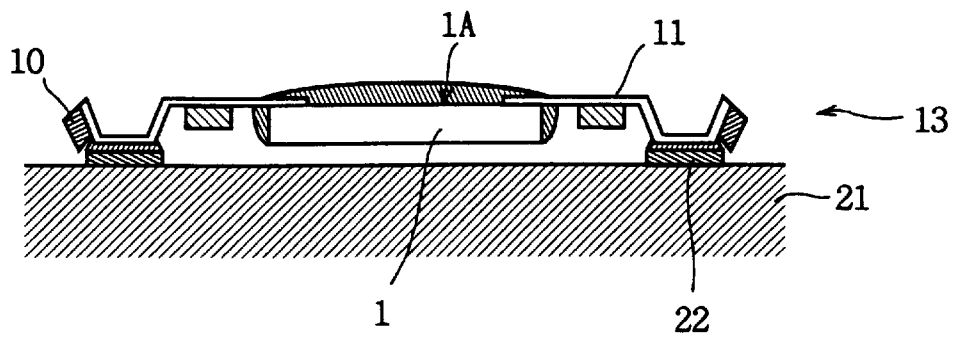
Figure 4A:
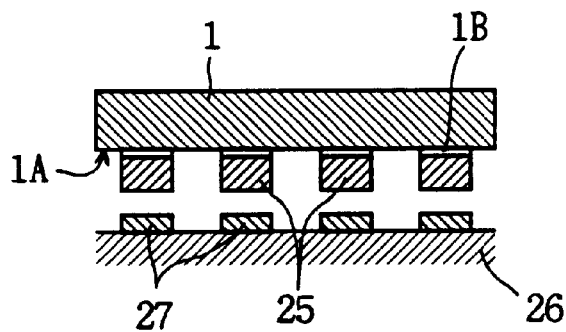
FIGS. 4A to 4C are cross-sectional views showing the process for mounting the IC chip on the board according to the F/C mounting method.
Figure 4B:
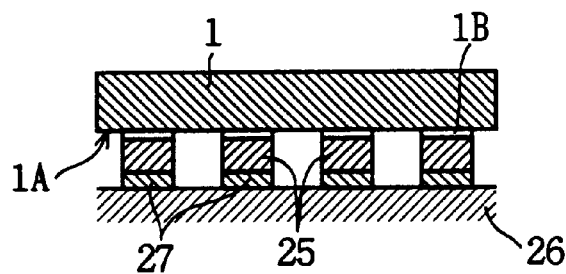
Figure 4C:
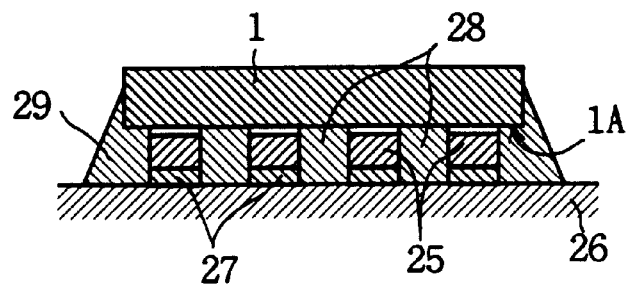
Figure 5A:
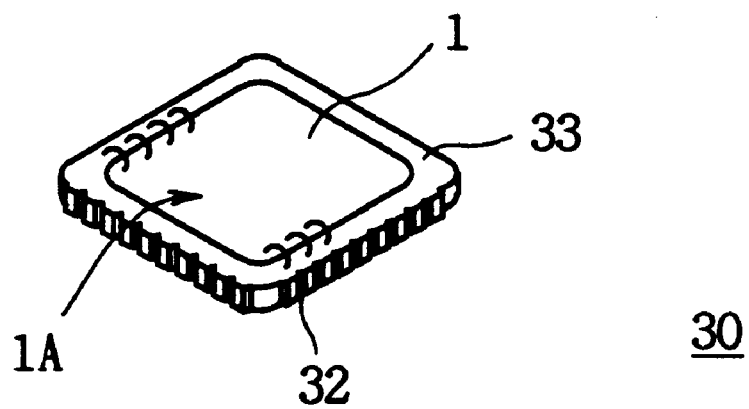
FIGS. 5A and 5B are perspective views showing the constitution of the LCCC and the PLCC.
Figure 5B:
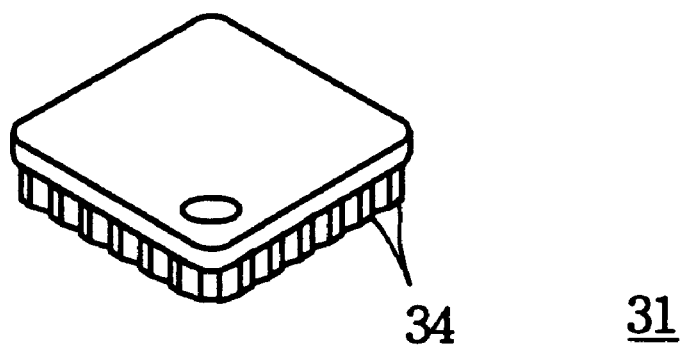

In this case, the semiconductor device 40 has nearly the same size as that of the IC chip 1, hence the mounting area of it may be nearly as large as that of the F/C mounting, therefore mounting of it on the board 60 (FIG. 11) can be performed with much higher density than the TCP 13 which has been formed into, for instance, gull-wing form (FIG. 3C), the usual LCCC 30 and the PLCC 31 (FIGS. 5A and 5B), etc. Besides, the semiconductor device 40 is mounted on the board 60 in such a way that each lead 42, as it is in a fixed state to the film tape 41, is bonded to the land 61 of the board 60 as seen in FIG. 11, therefore irregularity such as a curve of each lead 42 is not generated and the defective soldering is scarcely generated.

Besides, in the semiconductor device 40, visual inspection after mounting can be easily implemented, since soldering to the board 60 is performed at the tip portion of each lead 42 which is lying along the margin part of the back 1D of the IC chip 1 as mentioned above.

Besides, in the semiconductor device 40, soldering of each pad (not shown) of the IC chip 1 to the corresponding land 61 of the board 60 is performed through the intermediation of the filmy lead 42 which has been laminated on the elastic film tape 41, therefore stress which is generated owing to the difference between the thermal expansion coefficients of the film tape 42 and the board 60 can be decreased, so that high reliability during the heat-cycle can be obtained. Additionally, the IC chip 1 is mounted on the board 60 such that the circuit surface 1A faces upward, hereby the IC chip 1 can be mounted on the board 60 with an effective thermal radiation property.

Figure 2A:
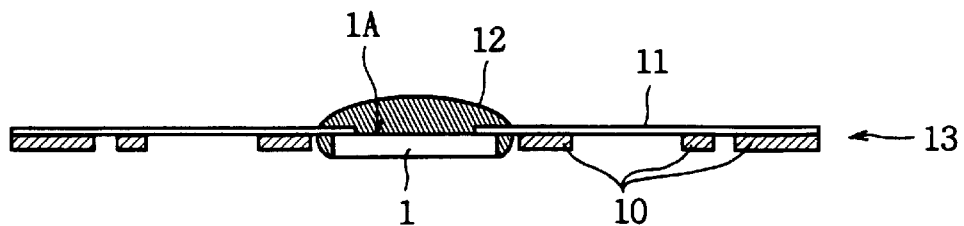
FIGS. 2A and 2B are a cross-sectional view and a top view showing the constitution of the usual TCP.
Figure 2B:
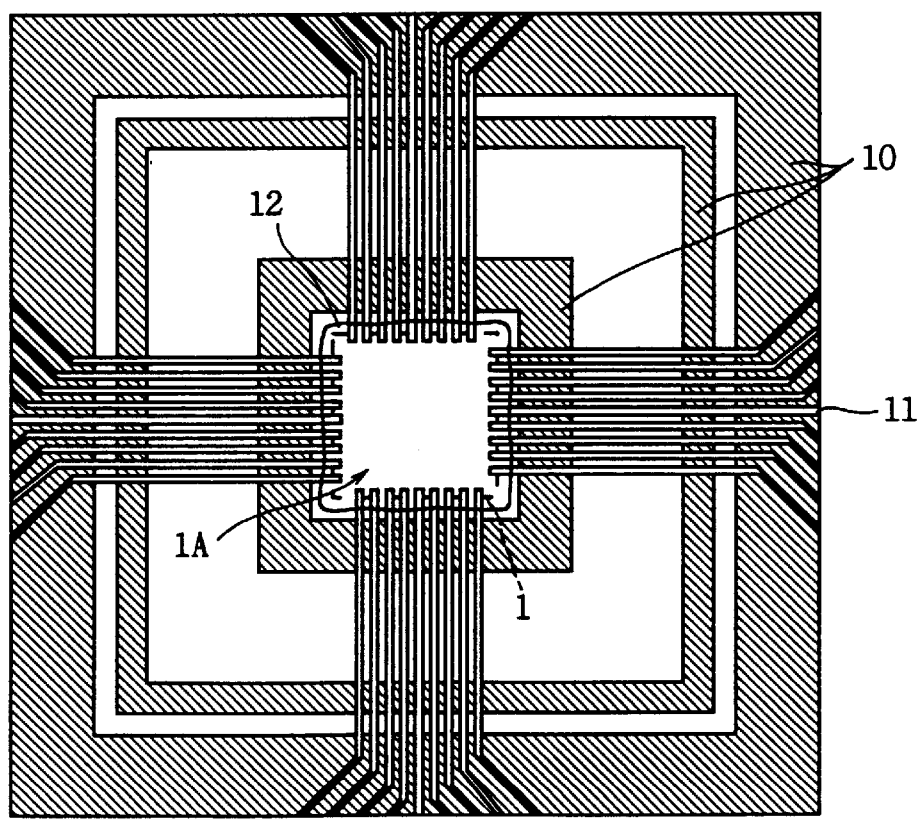

Moreover, the TCP 13 for, for instance, the conventional gull-wing type (FIGS. 2A and 2B) is supplied (delivered) in a state such that the film tape 10 at the outer lead part has been stamped out into the stated shape previous to being laminated with copper leafs as shown in FIGS. 2A and 2B, and the circuit surface 1A of the IC chip 1 has been sealed up with the resin 12 along with the inner lead part of each lead 11, therefore the filmy lead 11 has little portion which has been fixed to the film tape 10; as a result, there has been the problem such that damage of the lead 11 is apt to be generated at the time of delivering; however, the TCP 50 (FIGS. 8A and 8B) which is applied to the semiconductor device 40 has much portion which has been fixed to the film tape 41, hence, damage of the lead 42 on delivering can be prevented.

According to the above constitution, the semiconductor device 40 is formed in such a way that the leads 42 of the TCP 50 are bent so as to be laid along each peripheral side 1C of the IC chip 1; the excessive portions of the leads 42 and the film tape 41 are cut off; and then the portions, of the leads 42 and the film tape 41, which have protruded downwards from the IC chip 1 are bent so as to be laid along the back 1D of the IC chip 1; hereby the mounting area of it can be suppressed to nearly the same size as that of the IC chip 1, while high reliability during heat-cycle can be obtained. In this way a semiconductor device which is advantageous to high-density mounting and also greatly reliable can be realized, as well as the method for producing the same.

The abovementioned embodiment has dealt with the case where the semiconductor device 40 is produced using the TCP 50 wherein the inner circular part of the film tape 41 of the TCP 50 has been stamped out as shown in FIGS. 8A and 8B. However, the present invention is not limited to such. The semiconductor device 40 can be produced, for instance, in such a way that the stated insulating material (for example, polyimide) is attached or applied to the peripheral sides 1C as well as the margin part of the back 1D of the IC chip 1, and then the conductor pattern is formed on the surface of the material or in its inner part; besides, the other various methods can be applied as the producing method.

Besides, the abovementioned embodiment has dealt with the case where the film tape 41 of the TCP 50 has been made from the same material as the usual film tape 10. However, the present invention is not limited to such, but, for instance, the film tape 10 can be made from thermoplastic or thermosetting adhesive film or from the other adhesive film. In this way, it is possible to fix the leads 42 on the IC chip 1 strongly and to preserve the IC chip 1 from the external environment such as humidity.

As described above, according to this invention, the filmy material is placed along the peripheral sides of the semiconductor chip and one surface of the semiconductor chip, and the conductor pattern is provided on the filmy material such that one end of it is connected to the corresponding electrode which has been provided on the other surface of the semiconductor chip and the other end is opposed to the back of the semiconductor chip; hereby the semiconductor device can be produced which has nearly the same size as that of the semiconductor chip and which is scarcely affected by stress which is generated due to the discrepancy of thermal expansion coefficient with the board. In this way, a semiconductor device can be realized which is greatly reliable and also advantageous for high-density mounting.

Besides, the semiconductor device is produced in such a way that a cutting and bending process of each lead and the film tape is performed toward the tape carrier package, so that the other end of each lead is opposed to the back of the semiconductor chip, holding the film tape; hereby the semiconductor device can be produced which has nearly the same size as that of the semiconductor chip and which is scarcely affected by stress which is generated due to the discrepancy between thermal expansion coefficients of the board and the device. In this way, a method can be realized for producing a greatly reliable semiconductor device which is advantageous for high-density mounting.

While the preferred embodiments of the invention, have been described it will be obvious to those skilled in the art that various changes and modifications may be made. The appended claims cover all such changes and modifications as fall within the true spirit and scope of the invention.

What is claimed is:

1. A semiconductor device comprising:
   a semiconductor chip having an upper surface, a lower surface, and opposed lateral sides;
   a film disposed along each of said lateral sides of said semiconductor chip and on a peripheral portion of the lower surface of said semiconductor chip as to be wrapped around the lateral sides such that a central portion of said semiconductor chip is exposed, wherein said film engages each of said lateral sides and said peripheral portion of said lower surface; and
   a plurality of leads disposed on said film which are directly connected to corresponding electrodes provided on the upper surface of said semiconductor chip such that said plurality of leads are in direct contact with said electrodes of said semiconductor chip, said plurality of leads being disposed on said film such that each said lead has an end which is opposed to said lower surface of said semiconductor chip and said plurality of leads are disposed along each of said lateral sides of said semiconductor chip.

2. The semiconductor device according to claim 1, further comprising a seal which covers said upper surface of said semiconductor chip including said connection between said plurality of leads and said electrodes.

3. The semiconductor device according to claim 1, wherein said film comprises a thermoplastic or thermosetting adhesive film, wherein said adhesive film is in direct contact with each of said lateral sides and said peripheral portion of said lower surface.

4. The semiconductor device according to claim 1, wherein said film comprises a film tape on which said plurality of leads are laminated.

5. The semiconductor device according to claim 4, wherein said leads are disposed entirely on said film tape except for the connections to said electrodes on said upper surface of said chip.

6. The semiconductor device according to claim 1, wherein said film is made of polymide.

7. The semiconductor device according to claim 1, further comprising a circuit board having a plurality of lands, said ends of said leads opposed to said lower surface of said semiconductor chip each being electrically connected to one of said lands.

8. The semiconductor device according to claim 1, wherein said film completely covers all said laterals sides of said semiconductor chip.

9. The semiconductor device according to claim 2, wherein said seal is a silicon resin.

* * * * *